United States Patent [19]
Blanton

[11] Patent Number: 5,056,215
[45] Date of Patent: Oct. 15, 1991

[54] METHOD OF PROVIDING STANDOFF PILLARS

[75] Inventor: James A. Blanton, Kokomo, Ind.

[73] Assignee: Delco Electronics Corporation, Kokomo, Ind.

[21] Appl. No.: 624,794

[22] Filed: Dec. 10, 1990

[51] Int. Cl.[5] .............................................. H05K 3/34
[52] U.S. Cl. ................................. 29/840; 228/180.2; 361/400
[58] Field of Search .............................. 361/398, 400; 228/180.1, 180.2; 29/840

[56] References Cited

U.S. PATENT DOCUMENTS

| | | |
|---|---|---|
| 3,811,186 | 5/1974 | Larnerd et al. . |
| 3,871,015 | 3/1975 | Lin et al. .............................. 357/67 |
| 3,887,760 | 6/1975 | Krieger et al. ...................... 174/68.5 |
| 4,067,104 | 1/1978 | Tracy . |
| 4,581,680 | 4/1986 | Garner ............................... 361/480 X |
| 4,595,610 | 10/1985 | Lakritz et al. ................. 228/180.2 X |
| 4,604,644 | 8/1986 | Beckham et al. ...................... 357/80 |
| 4,673,772 | 6/1987 | Satoh et al. .......................... 29/840 X |
| 4,682,414 | 7/1987 | Butt ....................................... 29/840 |
| 4,766,670 | 8/1988 | Gazdik et al. ..................... 29/840 X |
| 4,859,808 | 8/1989 | Jeter et al. . |
| 4,878,611 | 11/1989 | LoVasco et al. ................. 228/180.2 |
| 4,965,700 | 10/1990 | McBride ............................. 361/398 |

OTHER PUBLICATIONS

IBM Technical Discl. Bull., vol. 11, No. 7, Dec. 1968, p. 769, by J. Noubel et al.
IBM Technical Discl. Bull., vol. 29, No. 11, Apr. 1987, pp. 4736–4737.

*Primary Examiner*—Carl J. Arbes
*Attorney, Agent, or Firm*—Robert J. Wallace

[57] ABSTRACT

Pillars are formed on a substrate at the same time as electrical circuit components are formed thereon and of the same materials used to form the circuit, the pillars serving to maintain standoff of an integrated circuit chip during bonding of solder bumps on the chip underside to the formed substrate circuit. The pillars are provided without extra materials and steps, under the existing alignment requirements for providing the circuit components, during the applying of a series of discontinuous layers, e.g., by screen printing, onto the substrate to form the circuit, by also applying portions of the series of layers as stacked layers in spaced island areas to form the pillars at otherwise unused substrate sites.

14 Claims, 3 Drawing Sheets

METHOD OF PROVIDING STANDOFF PILLARS

FIELD OF THE INVENTION

This invention relates to the provision of substrate pillars to maintain chip standoff and, more particularly, to the forming of pillars and an electrical circuit on a substrate for pillar standoff of an integrated circuit chip during bonding of solder contact bumps on the chip to the substrate circuit.

BACKGROUND OF THE INVENTION

One type of integrated circuit is termed a flip chip and is a miniature, flat, typically rectangular, electronic device having on one side a plurality of solder contact deposits, i.e., slight protrusions or balls, termed contact bumps, usually in a spaced-apart linear perimetric array about its periphery. The bumps electrically and mechanically connect circuit components of the chip to those of a substrate, e.g., a ceramic or polymer substrate of electrically insulating and solder non-wettable material, on solder bonding the bumps to corresponding discrete contact areas of conductive leads (fingers) on the substrate.

The chip is normally flipped over so that the bumps depend from its underside, and the bumps are positioned in registering contact with the substrate circuit finger contact areas. On heating the bumps to effect molten solder flow (reflow), the chip floats on the solder and, unless controlled by control means, the solder flows beyond the finger contact areas under solder wicking (wetting), and chip weight squeezing, action.

Depending on the bump volume and spacing, molten solder surface tension and chip weight, this uncontrolled flow can lead to solder bond connections (joints) of uncontrolled shape, height and breadth, causing non-uniform operation and shorting out of circuit components, e.g., where the flows from adjacent bumps coalesce. Expansion and contraction stresses induced during thermal cycling of the chip and substrate in use can cause failure of these non-uniform solder joints.

As minimum spacing between bumps maximizes chip density (number of bumps and circuit components), increasing bump spacing to avoid this flow problem is unsuitable. Instead, a soldered substrate and chip combination of maximum component density for a given size chip, and having uniform solder joints, is obtained by using control means to control solder flow during the bonding step to confine each bump to its corresponding substrate finger contact area.

One control means involves mechanical standoff elements of extraneous material, such as vertical pins, walls or laminated layer columns, interposed between the chip and substrate to elevate the chip a desired height above the substrate when the solder is molten, for forming solder joints of controlled shape, height and breadth. These extraneous standoff elements require extra materials and steps, and precise location of the standoff elements on the chip and/or substrate.

Another control means involves solder flow controlling extraneous material layers, such as solder dams or chrome stops, applied on the substrate to limit the solder joints to confined finger contact areas. These dams and stops require extra materials and steps, precise location of the dams or stops at the contact areas, and precise alignment of the bumps and contact areas in positioning the chip on the substrate.

U.S. Pat. No. 3,871,015 (Lin et al.) shows a semiconductor chip connected by solder balls (bumps) on its underside to substrate finger contact areas, upon molten flow of the solder bumps in overlying contact with the contact areas. Standoff (i.e., the distance between chip and substrate) is maintained by using some copper bumps as standoff elements to space the chip and substrate during solder flow for preventing collapse of the solder bumps and shunting out (short circuiting) of chip elements. As copper is rigid [of 1083° C. melting point, per Merck Index, 11th ed. 1989, p. 393], while solder is flexible, the copper joints with the fingers are fracture prone, consequent temperature changes (thermal cycling) between on and off states of the soldered chip and substrate in use that induce stresses due to differential chip and substrate thermal expansion.

As solder bumps tend to collapse during solder flow, the solder wettable area on the substrate is limited in the Lin et al. patent by use of fingers of solder non-wettable metal except in the contact areas which are of solder wettable metal, or by use of solder non-wettable dielectric material, e.g., solder dams, to confine the molten solder to the finger contact areas. Limiting the wettable area to confine the solder enables its molten surface tension to maintain a bump shape that supports the chip above the substrate (as a self-acting standoff).

The Lin et al. patent makes clear that the longer the standoff height, the greater the elongation of the molten solder bump for the wettable finger contact area, so that the solder bump dimensions on cooling to form the joint can be controlled by controlling the standoff height. By varying the geometry (wide or narrow bumps) or material (solder or copper bumps, or wettable finger contact area) among the joints, their stress resistance can be varied to decrease thermal cycle caused failure and increase joint life. However, copper standoff bumps and solder dams require extra materials and steps, copper joints are failure prone, and dams require precise location at the finger contact areas.

U.S. Pat. No. 4,604,644 (Beckham et al.) shows a semiconductor chip with solder bumps on its entire underside for area bonding to contact areas on the entire substrate surface, without use of standoff elements. A resin (adhesive) embeds the peripheral region of the bumps to increase chip and substrate edge bonding to offset thermal cycling induced stresses in use. As solder bumps exist on the entire chip underside in area bonding, chip weight squeezing action is obviously negligible.

U.S. Pat. No. 4,067,104 (Tracy) shows conductor columns, built up of indium layer areas in matrix photoresist layers by a stepwise process, on the entire top of a processor chip to connect its components (FET switches) to those (photodiodes) of an overlying detector chip upon area bonding of the columns to pads on the entire detector chip underside, without use of standoff elements. The photoresist layers embed the indium layers to prevent column distortion during bonding, after which the photoresist layers are removed by solvent dissolution. The photoresist layers are akin to solder dams and the indium columns are akin to solder bumps [indium being of 155° C. melting point, per Merck Index, 11th ed. 1989, p. 784].

U.S. Pat. No. 4,878,611 (Lo Vasco et al.) shows area bonding of solder bumps on the entire underside of an integrated circuit package (chip) to mating solder bumps on a substrate, on molten coalescence of the opposed bumps. Standoff pins depend from the chip so that the pin ends are spaced from the substrate when the opposed bumps are in contact, to control bump collapse by limiting downward chip movement when the solder is molten. The standoff height controls solder joint height and shape in conjunction with flux applied to the bumps to reduce solder surface energy (surface tension). Standoff pins require extra materials and steps, precise pin location on the chip and precise pin alignment with opposing portions of the substrate.

U.S. Pat. No. 3,887,760 (Krieger et al.) shows glass layers in the nature of solder dams at the substrate finger contact areas. On solder flow, solder deposited on each finger is constricted by the dams to limit its flow to the contact area for bonding to a connection on the underside of an overlying semiconductor chip, without use of standoff means. These dams require extra materials and steps, precise dam location at the fingers and precise alignment of the chip connections and fingers on positioning the chip on the substrate.

U.S. Pat. No. 3,811,186 (Larnerd et al.) shows an integrated circuit chip with solder bumps on its underside that connect with mating solder bumps on a substrate upon solder flow under a hot gas flow squeezing pressure. Photoresist deposits applied to the substrate form hot gas flow pressure distortable solder dam and standoff means to control chip spacing and the height and shape of the mating bump joints during solder coalescing, after which the photoresist deposits may be dissolved away. These photoresist solder dam and standoff means require extra materials and steps, precise dam location at the substrate bumps and precise alignment of the chip bumps and substrate bumps on positioning the chip on the substrate.

U.S. Pat. No. 4,859,808 (Jeter et al., which is assigned to the same assignee as the present patent application) shows solder dams in a special pattern adjacent special finger contact areas of a substrate. The dams confine molten flow of solder bumps on a semiconductor chip underside for bonding the chip to the substrate within high misalignment tolerances between the bumps and contact areas, without use of standoff means.

It is desirable to provide standoff means to space an integrated circuit above a circuit containing substrate on solder flow bonding to discrete contact areas on the substrate of solder contact deposits or bumps depending from the integrated circuit underside, without the need for extra materials and steps or precise location of the standoff means on the substrate.

SUMMARY OF THE INVENTION

In accordance with the invention, standoff pillars are provided on a support and interconnection type substrate that are formed at the same time as the circuit components are formed on the substrate and of the same materials used to form the circuit components. The standoff pillars are formed without the need for extra materials and steps, or precise location of the pillars on the substrate, thereby avoiding the above problems.

The invention contemplates a method of providing standoff pillars to space an integrated circuit, such as an integrated circuit chip, above an electrical circuit containing support surface of a substrate during solder flow bonding to discrete electrical circuit contact areas (finger contact areas) on the support surface of solder contact deposits (bumps) depending from the integrated circuit (chip) underside.

The method comprises forming a series of discontinuous layers on the substrate support surface, each layer comprising a selective circuit component material. The layers are disposed on the substrate surface individually in a selective pattern of circuit functioning areas and at least some of the layers commonly in at least three spaced-apart non-circuit island areas arranged as apexes of an imaginary polygon.

In this way, the substrate is provided with a circuit layer pattern composite of selectively electrically connected and selectively electrically insulated circuit component functioning areas defining an electrical circuit and including a contact layer portion of electrically conductive material of selective height containing discrete electrical circuit contact areas arranged for solder flow bonding thereto of corresponding integrated circuit (chip) solder contact deposits. It is also provided with at least three laminar plateaus comprising at least some of the layers of the series stacked in the at least three island areas and defining standoff pillars of substantially common height selectively longer than the height of the contact layer portion containing the contact areas.

The layers comprise individual layers of electrically conductive material (e.g., palladium and silver), electrically insulating material (e.g., glass), and electrically resistive material (e.g., ruthenium), in selective sequence.

Typically, the substrate is a ceramic substrate, and the layers comprise a first electrically conductive material layer applied as a first layer on the substrate and including the contact layer portion containing the discrete contact areas, a first dielectric material layer applied as a second layer onto selective underlying portions of the first layer, a second dielectric material layer applied as a third layer onto the second layer, a second electrically conductive material layer applied as a fourth layer onto the substrate and onto selective underlying portions of the third layer, and at least two individual electrically resistive material layers applied sequentially as further layers.

The layers subsequent to the first layer are applied so as to leave exposed the contact layer portion containing the discrete contact areas, the fourth layer is applied in a pattern including crossover portions relative to underlying portions of the first layer and the intervening second and third layers, and the third layer is applied to form a pinhole eliminating seal on the second layer to maximize electrical separation between the crossover portions of the fourth layer and the underlying portions of the first layer.

Each pillar preferably comprises the series of layers in sequentially stacked disposition. Typically, each layer has a height of about 0.0005 to 0.0006 inch, and the pillars have a common height of about 0.003 to 0.004 inch.

Typically, the layers are formed by printing (e.g., screen printing), drying and heat fusing in site of thick slurries of the corresponding circuit component materials in selective patterns on the, e.g., ceramic, substrate.

The integrated circuit (chip) has on its underside depending solder contact deposits of selective height slightly longer than the height of the standoff pillars and arranged for registry with corresponding discrete contact areas on the contact layer portion. The integrated circuit (chip) is positioned on the substrate with its solder deposits substantially in registering contact with the substrate contact areas so that its underside overlies the pillars and is spaced upwardly therefrom to form a slight gap therewith. Then, the solder deposits are heated to effect molten solder flow, initial self-aligning floating of the integrated circuit (chip) on the substrate via the molten solder deposits, and eventual settling of the integrated circuit (chip) on the pillars, whereupon the solder deposits are cooled to form electrical and mechanical connections with the discrete contact areas of selective solder height and breadth in dependence upon the corresponding heights of the contact layer portion, pillars and solder deposits.

Typically, the gap height is about 0.001 to 0.002 inch, the solder deposits prior to molten flow have a height of about 0.0045 to 0.0065 inch and breadth of about 0.007 to 0.0075 inch, and the pillars have a height of about 0.003 to 0.004 inch.

The invention also contemplates the substrate product, i.e., with said electrical circuit and standoff pillars, and its soldered combination with the chip.

Viewed from one aspect, the present invention is directed to a method of forming spacers during the forming of a circuit on a support member, comprising applying to a surface of the support member a plurality of layers of individually selective materials including electrically conductive material to dispose such layers in layer portions on the support member surface. These layer portions comprise first layer portions of the electrically conductive material of selective height located on the support member surface and selected so as to facilitate soldered electrical connection thereto of corresponding solder deposits on a surface of an electrical component (e.g., an integrated circuit chip) at a selective distance from the electrical component surface. These layer portions also comprise second layer portions which comprise all of the layers of the individually selective materials located on the support member surface and selected so as to define a circuit electrically connected to the first layer portions. These layer portions further comprise third layer portions which comprise two or more of the same said layers of the individually selective materials as the second layer portions and located on the support member surface and being stacked one on the other so as to form at least three separated spacers of selective height. The height of the spacers is greater than the height of the first layer portions and less than the height of the solder deposits from the electrical component surface.

In this way, when the solder deposits on the electrical component are melted and soldered to areas of the first layer portions, the spacers limit the distance between the electrical component surface and the support member surface to the height of the spacers.

Viewed from another aspect, the present invention is directed to an apparatus comprising the support member having on its surface said plurality of layers forming the first, second and third layer portions, and in turn also to the soldered combination thereof with the electrical component.

The invention will be better understood from the following more detailed description taken with the accompanying drawings.

It is to be noted that the drawings are not to scale, some portions being exaggerated to make them easier to understand.

DETAILED DESCRIPTION

Figure 1:
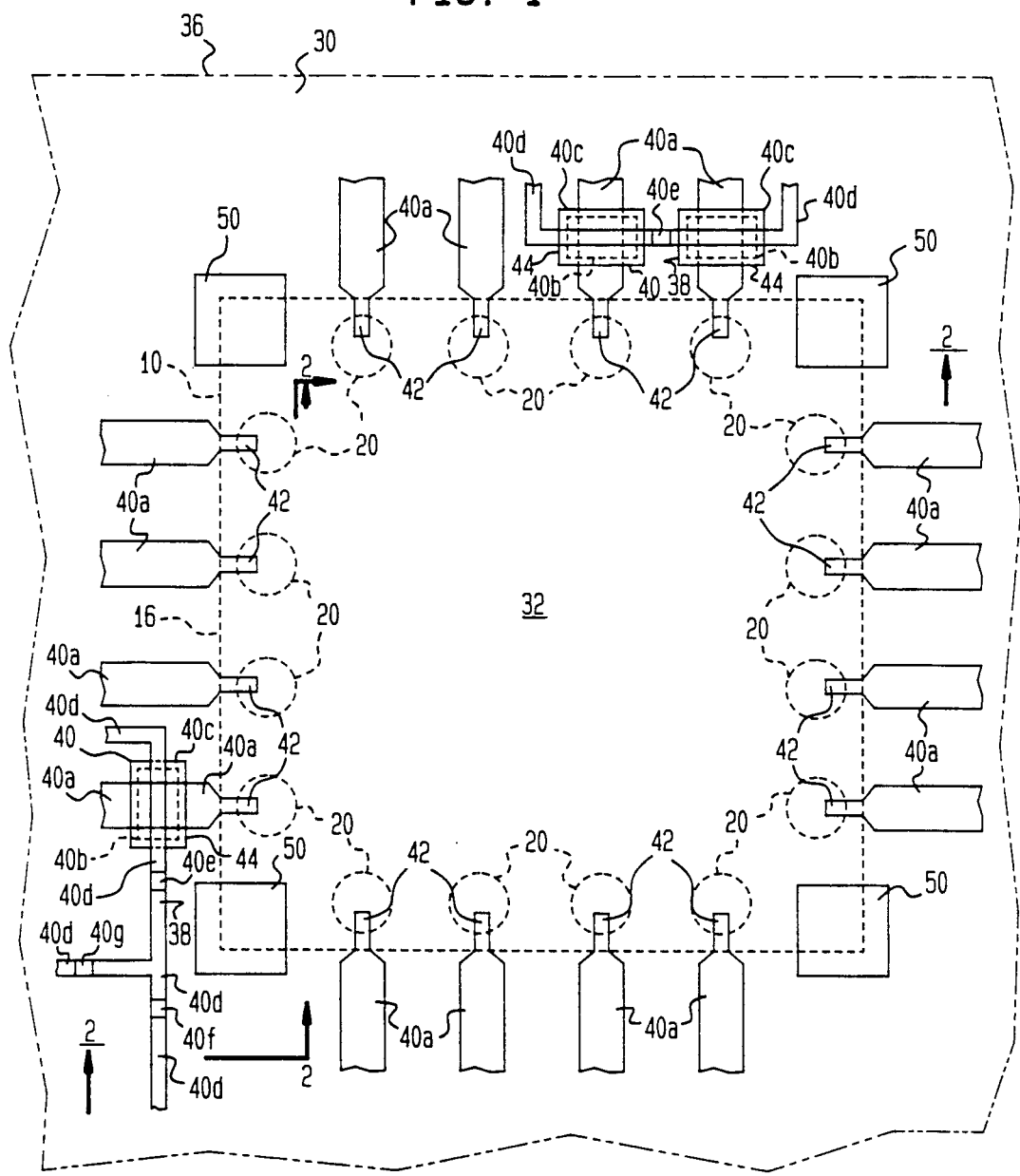
FIG. 1 is a top view of an arrangement according to an embodiment of the invention, showing portions of a substrate containing an electrical circuit including conductive fingers with discrete contact areas, and four standoff pillars arranged as apexes of an imaginary rectangle, and also showing by dashed line an overlying rectangular integrated circuit chip.
Figure 3:
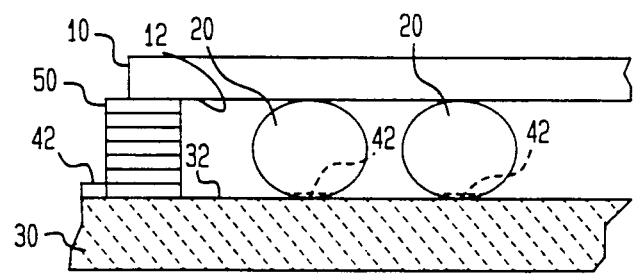
FIG. 3 is a sectional view, similar to a portion of FIG. 2, of the arrangement after bonding the chip and substrate.
Figure 2:
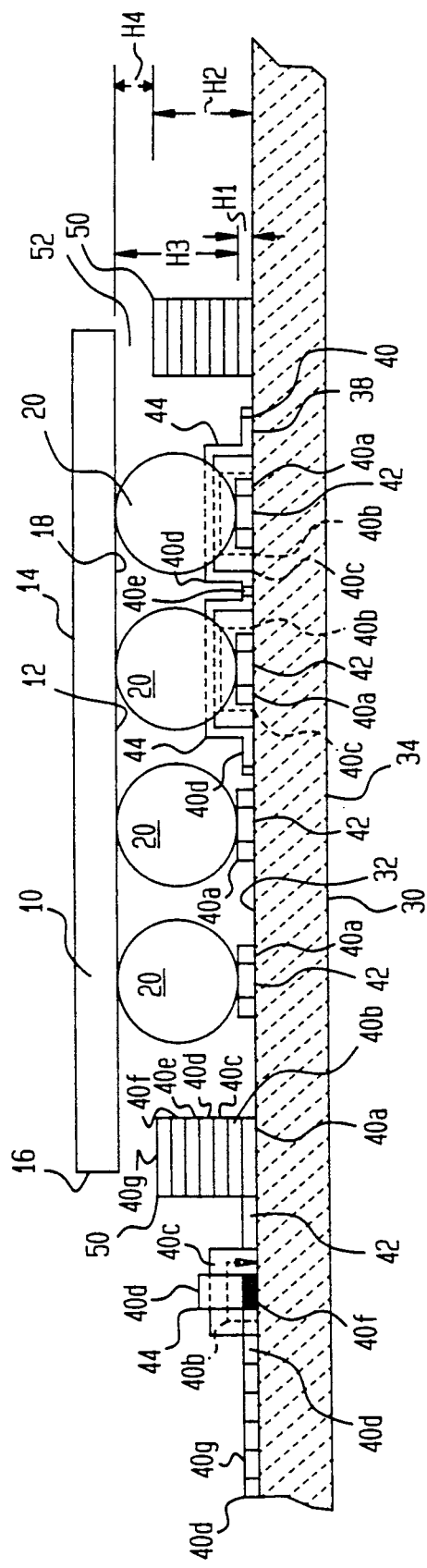
FIG. 2 is a sectional view, along line 2—2 of FIG. 1, indicating the spatial relationships of various parts of the arrangement before solder bonding of the chip to the substrate.

Referring now to FIGS. 1, 2 and 3, an arrangement is shown of a conventional integrated circuit (e.g., a flip chip having solder bumps) 10 (shown by a dashed line) overlying an otherwise conventional circuit containing substrate (support member) 30 (partially shown) that has been modified to provide standoff pillars (spacers) 50 in accordance with the present invention to space the chip 10 above the substrate 30 during solder flow bonding of the chip 10 to the substrate 30. Flip chip 10 may be denoted as an electrical component.

Chip 10 is typically a flat, polygonal, e.g., rectangular, semiconductor device having an underside 12, a top side 14 and a perimetric edge 16, plus solder contact deposits formed as contact bumps 20 (shown as dashed lines) depending from underside 12 and electrically connected to circuit components (not shown) in chip 10. Bumps 20 are linearly perimetrically arranged about the periphery of chip 10, e.g., with four bumps 20 disposed along each of its four perimetric sides inwardly of edge 16 so as to leave clear the four corners and central area of the chip. For clarity, bumps 20 are shown as balls of exaggerated size, especially as to their width or diameter (indicated by dashed line in FIG. 1), relative to corresponding parts of substrate 30.

Substrate 30 is typically a flat element of solder non-wettable dielectric material, e.g., ceramic or polymeric material, that may be part of a large panel of substrates to facilitate their common fabrication before being individually separated. Substrate 30 has a top side 32, an underside 34 and a perimetric edge 36 (schematically denoted by dot-dash line in FIG. 1), and as fabricated is normally of larger size than chip 10, yet of similar polygonal, e.g., rectangular, shape thereto. This is because substrate 30 is conventionally provided on top side 32 with an electrical circuit 38 (portions of which are shown in FIG. 1), composed of a series of discontinuous layers 40 located outwardly of the periphery of chip 10 when the chip is bonded by bumps 20 to substrate 30.

Layers 40 include a first layer 40a, a second layer 40b, a third layer 40c, a fourth layer 40d, a fifth layer 40e, a sixth layer 40f and a seventh layer 40g, each comprising an individual circuit component material. Layers 40 are disposed on top side 32 individually in selective patterns of circuit functioning areas that collectively form a circuit layer pattern composite of selectively electrically connected and insulated circuit component functioning areas defining circuit 38. First layer 40a has contact layer portions forming conductive fingers that contain discrete circuit contact areas 42 that are bondable to bumps 20. First layer 40a also has layer crossovers 44.

As substrate 30 is of dielectric material, first layer 40a may be a first electrically conductive material layer applied to top side 32. To accommodate crossovers 44, second layer 40b may be a first dielectric material layer applied in discrete areas onto the first layer 40a underlying portions at the crossover sites to overlap layer 40a and contact top side 32, and third layer 40c may be a second dielectric material layer applied in like discrete areas onto second layer 40b to overlap layer 40b and contact top side 32 outwardly of the layer 40b discrete areas. Fourth layer 40d may be a second electrically conductive material layer applied to top side 32 in a pattern forming crossovers 44 with first layer 40a.

Fifth, sixth and seventh layers 40e, 40f and 40g may be electrically resistive material layers individually applied sequentially in discrete areas at selective sites in conductive first and fourth layers 40a and 40d as resistor functioning areas connected in the circuit line functioning areas formed by the first and fourth layers. First and fourth layers 40a and 40d are connected to components (not shown) of circuit 38 located outwardly of the substrate 30 area at which chip 10 is located, and are electrically isolated from each other at crossovers 44 by intervening second and third layers 40b and 40c.

Although second layer 40b is of dielectric material that insulates first layer 40a from fourth layer 40d at crossovers 44, as a precaution third layer 40c of dielectric material is provided at the crossovers to form a pinhole eliminating seal on layer 40b to maximize electrical separation between the underlying portions of first layer 40a and the crossover portions of fourth layer 40d. The series of discontinuous layers 40 is arranged so that each layer is disposed on top side 32 of substrate 30 in cooperating discrete areas that form a circuit layer pattern composite constituting a monolayer, except at crossovers 44. Layers 40 subsequent to first layer 40a are applied so as to leave exposed contact areas 42.

As is clear from FIG. 1, the portion of this monolayer adjacent the four sides of the rectangular central area of substrate 30 at which chip 10 is accommodated is formed of first layer 40a. At this substrate central area, first layer 40a includes four sets of side-by-side centrally pointing conductive finger contact areas 42 whose inner ends are linearly perimetrically arranged about the periphery of overlying chip 10 so as to overlap chip edge 16 and correspondingly align contact areas 42 with chip bumps 20, e.g., with four side-by-side contact areas 42 disposed along each of the four perimetric sides of the central area while leaving clear the four corners of the central area.

As is clear from FIG. 2, substrate 30 is electrically and mechanically connected to chip 10 by solder bonding chip bumps 20 to contact areas 42 of first layer 40a. Bumps 20 are placed in registering contact with corresponding contact areas 42 and the arrangement is heated to effect molten solder flow of the bumps. Since the weight of chip 10 and surface tension of the molten solder cause bumps 20 to distort and spread beyond the confines of contact areas 42 at which the solder bond connections (joints) are desired, which leads to non-uniform solder bonding and adverse circuit performance as earlier described, extraneous material control means such as solder dams, chrome stops or standoff elements, provided by extra steps, have been used heretofore to avoid this problem.

However, in accordance with the invention, this problem is singularly avoided, not by extraneous material control means provided by extra steps, but by indigenous material standoff pillars 50 provided by the same steps used to form substrate circuit 38, and at the same time as the circuit 38 is formed and from the same series of layers 40 used to form the circuit 38.

Since the corners of chip 10 and those of the rectangular central area of substrate 30 are clear, they present convenient areas for locating standoff pillars 50 in the arrangement. Pillars 50 are built up on top side 32 at the corners of the rectangular central area of substrate 30 from the same series of applied layers 40 and at the same time these layers are individually applied to substrate 30 to form circuit 38.

As is clear from FIG. 2, each of pillars 50 may be composed of some or all of the series of layers 40b, 40c, 40d, 40e, 40f and 40g, in sequentially stacked disposition. Since these stacked layers are of the same indigenous materials as layers 40 that permanently make up circuit 38, pillars 50 are also permanent parts of the arrangement, and will likewise not distort or deform during heating of bumps 20 to effect molten solder bonding of chip 10 to substrate 30. Since these stacked layers are applied at the same time as layers 40 are applied to form circuit 38, pillars 50 are formed without extra fabrication steps. Thus, pillars 50 are provided essentially without extra cost and result in no extraneous material waste.

Since pillars 50 are formed as part of the normal fabrication process, their location is precisely determined in the same way and at the same time as the locations of all other parts of discontinuous layers 40 are precisely determined to provide circuit 38. The series of layers 40 is applied so that they are disposed on top side 32 individually in a selective pattern of circuit functioning areas, formed by layers 40a, 40b, 40c, 40d, 40e, 40f and 40g, with at least some said layers commonly in the corners of the substrate rectangular central area as pillar island areas, i.e., arranged as apexes of an imaginary polygon, e.g., a rectangle (see FIG. 1).

On the one hand, substrate 30 is provided with the usual circuit layer pattern composite of selectively electrically connected circuit component functioning areas (per first layer 40a, fourth layer 40d, and fifth, sixth and seventh layers 40e, 40f and 40g), and selectively electrically insulated circuit component functioning areas (per second and third layers 40b and 40c at crossovers 44). These functioning areas define circuit 38, including the contact layer portion of first layer 40a containing finger contact areas 42. Contact areas 42 are of selective monolayer height (thickness) H1 (see FIG. 2).

On the other hand, substrate 30 is simultaneously provided with corner laminar plateaus comprising at least some of layers 40a, 40b, 40c, 40d, 40e, 40f and 40g of the series of layers 40 stacked in the pillar island areas that define pillars 50 of common standoff height H2 selectively longer (higher) than height H1 of contact areas 42 of first layer 40a (see FIG. 2).

Pillars 50 are located on top side 32 of substrate 30 so as to be aligned with the corners of chip 10 and define a slight gap 52 with chip underside 12 when chip 10 is positioned on substrate 30 in overlying relation to pillars 50 and with bumps 20 in registering contact with corresponding contact areas 42. Bumps 20 have a depending height H3 that is selectively slightly longer (higher) than height H2 of pillars 50 and this determines the height H4 of gap 52 (see FIG. 2).

The upward spacing of chip 10 from pillars 50 that forms gap 52 determines the extent of molten solder collapse of bumps 20 during the solder bonding heating step. Upon heating bumps 20 to effect molten solder flow, chip 10 undergoes initial self-aligning floating on substrate 30 via the molten solder bumps and eventual settling onto pillars 50. Upon cooling bumps 20, the arrangement is provided with electrical and mechanical joints between bumps 20 and contact areas 42, of selective solder height and breadth in dependence upon the selective height H1 of contact areas 42, the selective height H2 of pillars 50 and the selective height H3 of bumps 20.

Typically, each layer 40, including each contact area 42 (and the composite circuit monolayer), has a height (thickness) H1 of about 0.0005–0.0006 inch (0.5–0.6 mil), and pillars 50 have a common height H2 of about 0.003–0.004 inch (3–4 mils), built up of a series of layers 40 each of said height (thickness) H1 of about 0.0005–0.0006 inch, and a square cross sectional shape, e.g., of about 0.015×0.015 inch (15×15 mils) size. Prior to molten flow, bumps 20 typically have a height H3 of about 0.0045–0.0065 inch (4.5–6.5 mils), for an average height H3 of about 0.0055 inch (5.5 mils), and a breadth or diameter of about 0.007–0.0075 inch (7–7.5 mils), so that gap 52 has a height of about 0.001–0.002 inch (1–2 mils).

In an illustrative embodiment, the chip 10 typically has a square shape, e.g., of about 0.25×0.25 inch (250×250 mils) size, and the substrate 30 has a rectangular shape, e.g., of about 1.5×2 inch size, and may initially form a part of a larger panel, e.g., of about 3.5×5.5 inch size before its separation into an individual unit.

It will be understood that chip 10, substrate 30 and pillars 50 may each be of any suitable size and shape (e.g., circular, elliptical, polygonal, such as triangular, square or other rectangular, pentagonal, etc., shape), permitting the invention and its advantages to be achieved.

Circuit 38 is formed on substrate 30 by conventional technique, such as by screen printing (through a patterned mask), drying, and heat fusing in situ, of thick slurries (thick film inks containing binders) of the circuit component materials in selective patterns to form layers 40a to 40g.

For example, substrate 30 is composed of dielectric material, such as ceramic material, and first layer 40a is applied to top side 32 as a first electrically conductive material layer, e.g., as a thick slurry of an alloy of palladium and silver with binders, such as DuPont material #6125 or #7474, by screen printing (step 1). Substrate 30 is then dried in an oven at about 150° C. for 10–15 minutes (step 2), air fired in a furnace at about 850° C. for about 10 minutes at peak (once the substrate reaches that temperature) to fuse layer 40a (step 3), and cooled to room temperature (step 4).

Second layer 40b is next applied to top side 32 as a first dielectric material layer, e.g., a thick slurry of glass, such as air-fired DuPont material #5707, by screen printing (step 1). Substrate 30 is then dried, fired and cooled in the same way as first layer 40a (steps 2 to 4). Third layer 40c is then applied to top side 32 as a second dielectric material layer, e.g., of the same material as second layer 40b, and by the same printing, drying, firing and cooling steps (steps 1 to 4).

Fourth layer 40d is next applied to top side 32 as a second electrically conductive material layer, e.g., of the same material as first layer 40a, and by the same printing, drying, firing and cooling steps (steps 1 to 4).

After this, fifth layer 40e is applied to top side 32 as a first electrically resistive material layer, e.g., a thick slurry of ruthenium with binders, such as DuPont material #1600 or #6200, or ruthenium based series resistor material sold under the designation "Birox," by the same printing and drying steps as the previous layers (steps 1 to 2), but is not fired. Sixth layer 40f is applied as a second electrically resistive material layer, e.g., of the same material as fifth layer 40e, by the same printing and drying steps as fifth layer 40e (steps 1 to 2), and then seventh layer 40g is applied as a third electrically resistive material layer, e.g., of the same material as fifth and sixth layers 40e and 40f, by the same printing and drying steps (steps 1 to 2).

Substrate 30 is finally fired to fuse layers 40e, 40f and 40g simultaneously, and then cooled, by the same firing and cooling steps (steps 3 to 4) as the other layers.

This conventional four-step printing, drying, firing and cooling procedure provides circuit 38 on substrate 30 in the usual way. However, in accordance with the invention, pillars 50 are also formed at the same time as these steps are effected to provide substrate 30 with circuit 38 by applying a series of layers 40 to top side 32. The conventional steps are only modified by way of the invention to include provision in the printing step, e.g., in the screen patterns used to form the individual discontinuous layers, for placing print areas at those locations corresponding to the positions of pillars 50 on substrate 30, which are otherwise unused areas on top side 32.

According to the invention, a given printing of a layer 40 on substrate 30 has two functions: (1) to provide a conductor, dielectric, resistor, etc., in circuit 38 on top side 32, and (2) to provide a layer 40 of the cumulative stack of layers used to make each pillar 50 for supporting chip 10. These two functions are simultaneously satisfied on applying each layer 40 successively in the series of layers used to form circuit 38, as some or all of these layers are also applied to form pillars 50, depending on the number of stacked layers 40 needed to achieve the common selective standoff pillar height H2.

As pillars 50 are formed of materials that withstand the firing step (step 3) fusion temperature, they are not adversely affected by the conventional mild heating used to achieve molten solder flow for bonding chip 10 to substrate 30. Also, as the stack of layers 40 forming each pillar 50 typically includes one or both dielectric layers 40b and 40c, pillars 50 electrically insulate chip 10 from substrate 30.

Referring to FIG. 3, there is shown the soldered combination of the substrate 30 and the chip 10. It is formed in a conventional solder bonding step by heating the arrangement shown in FIG. 2, e.g., in a furnace at about 260° C. (±5° C.) for about 12 minutes (including the time for raising the arrangement from room temperature to the furnace temperature), i.e., sufficient for molten flow of solder bumps 20, e.g., of 50 percent lead/50 percent indium alloy of about 209° C. melting point, while resting on contact areas 42, and eventual settling of chip 10 on pillars 50. The soldered composite is then cooled. Flux paste may be applied between bumps 20 and contact areas 42 prior to bonding. This paste also serves to hold chip 10 in place on substrate 30 until soldering can be accomplished.

Because bumps 20 are taller than pillars 50 (see FIG. 2), chip 10 initially does not contact the pillars. On molten solder flow, chip 10 settles down as the solder melts and wets contact areas 42 until the chip is restrained from further settling by contact with pillars 50, which then support it. Pillars 50 are preferably located around the periphery of the area occupied by chip 10 to prevent the chip from contacting a given pillar 50 and using it as a pivot or fulcrum during its settling action on the molten solder, as this could cause vertical and/or horizontal chip misalignment and prevent some bumps 20 from bonding to the corresponding contact areas 42.

The final shape and dimensions of bumps 20 are determined for a given bump volume by the difference between bump height H3 and gap height H4, as this defines the final bump height between layer height H1 and that portion of pillar height H2 above layer height H1. As these heights are predetermined, pillar height H2 and surface tension action prevent solder flow from contact areas 42 onto the adjacent substrate top side 32. Providing substrate 30 of ceramic or other solder nonwettable material essentially inhibits solder flow onto top side 32.

During bonding step solder flow, bumps 20 are free to align with the corresponding contact areas 42 prior to settling of chip 10 on pillars 50 at standoff height H2 (the elevation of chip 10 above substrate 30). Thus, the print alignments of layers 40 are to this extent non-critical in forming the layer 40a finger portions containing contact areas 42 and the island areas of the series of layers 40 defining the pillar 50 stacked layers.

The four pillars 50 shown in FIG. 1 are conveniently located at the corners of the rectangular central area of top side 32 that demark the boundaries of the finger portions of layer 40a forming contact areas 42, so as to support the four corners of chip 10 at selected standoff height H2 during solder bonding. However, three or five or more pillars 50 may be used instead of four as shown in FIG. 1, and they may be placed in any unused spaced-apart areas on top side 32 so long as they do not interfere with bumps 20 when chip 10 is positioned to register the bumps with contact areas 42.

Of course, at least three pillars 50 are needed, and they must not be in linear array so as to form a pivot or fulcrum as above described but, rather, must be in spaced-apart planar array so as to form apexes of an imaginary polygon, e.g., a triangle, square or other rectangle, pentagon, hexagon, etc., for providing stable standoff supports to maintain chip 10 mechanically and uniformly at desired standoff height H2.

The arrangement of substrate 30 with pillars 50 according to the invention provides uniform spacing of bumps 20 relative to contact areas 42 without extraneous material standoff elements, solder dams, etc., and with reduced scrap compared to previous control means. As the stated printing operations are basic to the providing of circuit 38, building up pillars 50 during these normal printing operations is cost-free, since these operations are required anyway.

The arrangement and functions of the conventional chip and substrate components discussed herein (except for pillars 50, their formation method and their use as solder flow controlling standoff means according to the invention) are analogous to those in the solder dam flow control means teaching in the aforesaid U.S. Pat. No. 4,859,808 (Jeter et al., which is assigned to the same assignee as the present patent application). Said U.S. Pat. No. 4,859,808 is incorporated herein by reference.

Figure 4:
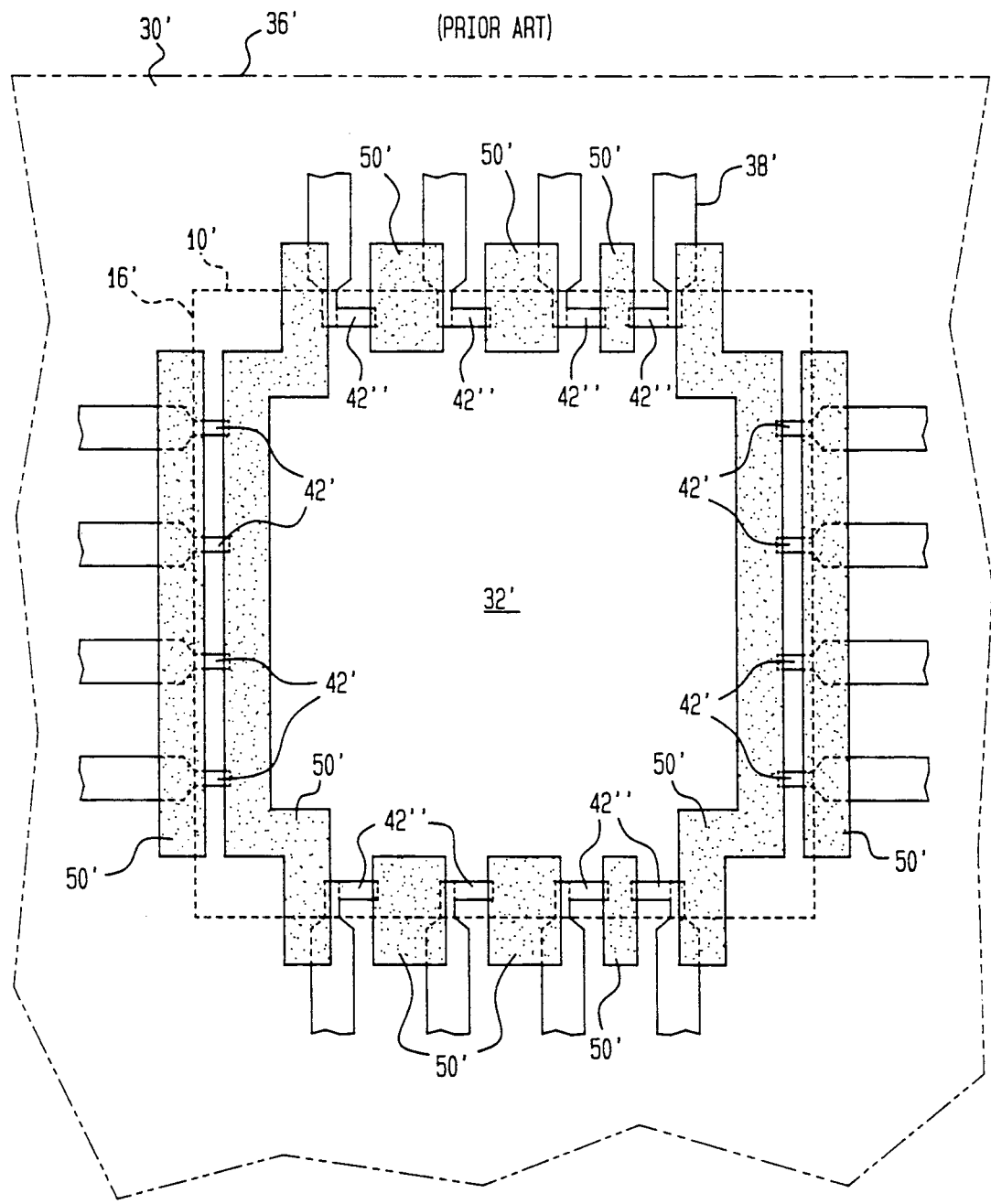
FIG. 4 is a top view, similar to FIG. 1, but of a PRIOR ART solder dam containing arrangement.

Referring now to PRIOR ART FIG. 4, in which analogous parts are assigned prime (') or double prime (") reference designations, and which exemplifies the solder dam flow control means teaching in the Jeter et al. patent (U.S. Pat. No. 4,859,808), it is seen (as viewed in FIG. 4) that the top and bottom sets of contact areas 42" define transversely offset, left to right, wide inner angled ends parallel to the top and bottom linear perimetric side portions of the rectangular central area of substrate 30' over which chip 10' is positioned. The left and right sets of contact areas 42, define the usual straight, left-to-right, narrow inner ends at right angles to the left and right linear perimetric side portions of that central area.

Solder dams 50', e.g., glass layers, are applied as parallel top-to-bottom strips of predetermined spacing width therebetween, both crosswise over the narrow inner ends 42' to limit the length of solder flow to that dam spacing width, and lengthwise over the side edges of the wide inner angled ends 42" to limit the width of solder flow to that same dam spacing width. As the width between strip dams 50' is less than the length of narrow ends 42' and also less than the width of the wide ends 42", wide tolerances are possible in aligning dams 50' simultaneously with ends 42' and 42" during fabrication.

Left-to-right misalignment is accommodated as the solder flow areas for the bumps (not shown) on chip 10' (shown by dash line in FIG. 4) are locatable within a wide range along the lengths of ends 42' and simultaneously along the widths of ends 42", by the left-to-right positioning of strip dams 50'. Top-to-bottom misalignment is accommodated as the solder flow areas are self-limited to the widths of ends 42' and lengths (angle widths) of ends 42", for any given top-to-bottom positioning of dams 50'. Use of a solder non-wettable substrate 30' prevents solder spreading. However, extraneous materials and steps are required, and extra substrate space for wide ends 42", as well as corresponding extra space between solder bumps on chip 10'.

Even so, the Jeter et al. patent teaching is an improvement over the usual, e.g., glass, solder dams formed of an outer and an inner rectangular ring spaced to define a solder dam annulus therebetween, and applied so that the annulus overlaps all finger ends. The annulus must be precisely aligned with the finger ends in both left-to-right and top-to-bottom directions.

As to chrome stops, these solder flow control means require precise alignment with the finger contact areas, and extraneous materials and steps, including masking and wet chemistry, to form chrome layers on the finger contact areas and then to etch restricted openings in the layers, to form the stops.

The present invention provides pillars that assure sufficient standoff height of flip chips from the substrates on which they are mounted, for ultimately achieving acceptable temperature cycling life for the soldered combination. Maintaining chip elevation by solder dams involves restricting the finger contact area wetted with solder by action of solder non-wettable bump confining surfaces, whereby the solder surface tension defines the final shape of the bump that supports the chip at sufficient standoff height for acceptable temperature cycling capability. Conveniently, the given standoff height aids later cleaning of the space under the mounted chip.

Fabrication of the usual solder dams requires strict alignment between the conductor print and solder dam print, or the solder bump pattern will not properly align with the finger contact areas. This is alleviated by wide finger ends 42" between dams 50' in the arrangement of FIG. 4, but at the expense of increased bump spacing along two chip edges, whereas current efforts seek even smaller bump spacing, and thus even stricter alignments. On the other hand, lithographic steps combined with wet room processing to form chrome stops of a higher degree of finger contact area registration are costly.

The present invention solves these shortcomings by eliminating solder dams or chrome stops in the substrate finger pattern in favor of pillars built up on the substrate to support the chip during solder flow (reflow) at a thereby maintained chip standoff height, without extraneous standoff elements of special materials as in the above Lin et al., Lo Vasco et al., and Larnerd et al. patents. Instead, the pillars herein are built up from the same materials and at the same time as the substrate prints (conductor, dielectric and resistor prints) are applied, and thus are provided essentially free of cost.

Registration of the overlaying prints (print areas) comprising the pillars is much less critical than for solder dams, and existing print registration requirements for forming the substrate circuit according to their normal function are sufficient for forming the stacked layers in building up the pillars according to their added function per the invention. Minimum bump spacing is no longer dictated by solder dam registration and printing limitations. During the bonding step, the chip is free to align with the finger pattern contact areas without constraint by the pillars, whose only function is to support the chip vertically. After the chip is mounted, the space under the chip can be cleaned by the cleaning solution, but more easily, as there are no confining solder dams.

The present invention broadly contemplates a support member having a surface provided with a plurality of layers of individually selective materials including electrically conductive material, in layer portions. These layer portions define a circuit that contains layer portion areas of electrically conductive material forming a plurality of electrical connection areas of selective height above the surface of the support member. These layer portions further define at least three separated spacers of selective height above the height of the electrical connection areas of the layer portion areas and formed of layer portions of two or more of the same said layers that define said circuit. This permits the mounting on the support member of an electrical component having a plurality of solder deposits depending from a surface thereof with the electrical component surface in contact with the spacers and the solder deposits soldered to corresponding electrical circuit connection areas of the layer portion areas of the electrically conductive material of the circuit.

The present invention also broadly contemplates the associated method of forming the spacers during the forming of the circuit on the support member, by applying to the support member surface the plurality of said layers in said layer portions, so as to define the circuit and the spacers, as aforesaid, as well as to the soldered combination of the so formed support member and the solder deposit containing electrical component.

Accordingly, it can be appreciated that the specific embodiments described are merely illustrative of the general principles of the invention. Various modifications may be provided consistent with the principles set forth.

The embodiments of the invention in which an exclusive property or privilege is claimed are defined as follows:

1. A method of providing standoff pillars to space an integrated circuit above an electrical circuit containing support surface of a substrate during solder flow bonding to discrete electrical circuit contact areas on the substrate support surface of solder contact deposits depending from the integrated circuit underside, comprising:
   forming a series of discontinuous layers on the substrate support surface, each layer comprising a selective circuit component material;
   the layers being disposed on the support surface individually in a selective pattern of circuit functioning areas and at least some of the layers commonly in at least three spaced-apart non-circuit island areas arranged as apexes of an imaginary polygon;
   so as to provide on the substrate a circuit layer pattern composite of selectively electrically connected and selectively electrically insulated circuit component functioning areas defining an electrical circuit and including a contact layer portion of electrically conductive material of selective height containing discrete electrical circuit contact areas arranged for solder flow bonding thereto of corresponding integrated circuit solder contact deposits, and at least three laminar plateaus comprising at least some of the layers of the series stacked in the at least three island areas and defining standoff pillars of substantially common height selectively longer than the height of the contact layer portion containing the discrete contact areas.

2. The method of claim 1 wherein the layers comprise individual layers of electrically conductive material, electrically insulating material and electrically resistive material.

3. The method of claim 1 wherein:
   the substrate is a ceramic substrate, and the layers comprise a first electrically conductive material layer applied as a first layer on the substrate and including the contact layer portion containing the discrete contact areas, a first dielectric material layer applied as a second layer onto selective underlying portions of the first layer, a second dielectric material layer applied as a third layer onto the second layer, a second electrically conductive material layer applied as a fourth layer onto the substrate and onto selective underlying portions of the third layer, and at least two individual electrically resistive material layers applied sequentially as further layers;
   the layers subsequent to the first layer being applied so as to leave exposed the contact layer portion containing the discrete contact areas, the fourth layer being applied in a pattern including crossover portions relative to underlying portions of the first layer and the intervening second and third layers, and the third layer being applied to form a pinhole eliminating seal on the second layer to maximize electrical separation between the crossover portions of the fourth layer and the underlying portions of the first layer.

4. The method of claim 3 wherein each pillar comprises the series of layers in sequentially stacked disposition.

5. The method of claim 1 wherein each layer has a height of about 0.0005 to 0.0006 inch.

6. The method of claim 1 wherein the pillars have a common height of about 0.003 to 0.004 inch.

7. The method of claim 1 wherein the substrate is a ceramic substrate, and the layers are formed by printing, drying and heat fusing in situ of thick slurries of the corresponding circuit component materials in selective patterns on the substrate.

8. The method of claim 1 wherein the layers include electrically conductive material layers comprising palladium and silver, electrically insulating material layers comprising glass and electrically resistive material layers comprising ruthenium.

9. The method of claim 1 wherein, after forming the layers on the substrate support surface, an integrated circuit having an underside surface containing depending solder contact deposits of selective height slightly longer than the height of the standoff pillars and arranged for registry with corresponding discrete contact areas contained on the contact layer portion is positioned on the substrate with the solder contact deposits substantially in registering contact with the discrete contact areas so that the underside of the integrated circuit overlies the pillars and is spaced upwardly therefrom to form a slight gap therewith;

the solder deposits are heated to effect molten solder flow, initial self-aligning floating of the integrated circuit on the substrate via the molten solder deposits, and eventual settling of the integrated circuit on the pillars; and then the solder deposits are cooled to form electrical and mechanical connections with the discrete contact areas of selective solder height and breadth in dependence upon the corresponding heights of the contact layer portion, pillars and solder deposits.

10. The method of claim 9 wherein the integrated circuit comprises an integrated circuit chip.

11. The method of claim 9 wherein the gap has a height of about 0.001 to 0.002 inch, the solder deposits prior to molten flow have a height of about 0.0045 to 0.0065 inch and a breadth of about 0.007 to 0.0075 inch, and the pillars have a height of about 0.003 to 0.004 inch.

12. A method of forming spacers during the forming of a circuit on a support member, comprising applying to a surface of the support member a plurality of layers of individually selective materials including electrically conductive material, in layer portions so as to define a circuit that contains layer portion areas of electrically conductive material forming a plurality of electrical connection areas of selective height above the surface of the support member, and further so as to define at least three separated spacers of selective height above the height of the electrical connection areas of said layer portion areas and formed of layer portions of two or more of the same said layers that define said circuit, for mounting on the support member an electrical component having a plurality of solder deposits depending from a surface thereof with the surface of the electrical component in contact with the spacers and the solder deposits soldered to corresponding electrical circuit connection areas of said layer portion areas.

13. A method of forming spacers during the forming of a circuit on a support member, comprising:

applying to a surface of the support member a plurality of layers of individually selective materials including electrically conductive material to dispose said layers in layer portions on the support member surface;

said layer portions comprising:

first layer portions of said electrically conductive material of selective height located on the support member surface and selected so as to facilitate soldered electrical connection thereto of corresponding solder deposits on a surface of an electrical component and depending a selective height from the electrical component surface;

second layer portions comprising all of said layers of said individually selective materials located on the support member surface and selected so as to define a circuit electrically connected to said first layer portions; and third layer portions comprising two or more of the same said layers of said individually selective materials as said second layer portions and located on the support member surface and being stacked one on the other so as to form at least three separated spacers of selective height, said height of the spacers being greater than said height of the first layer portions and less than said height of the solder deposits from the electrical component surface such that when the solder deposits on the electrical component are melted and soldered to areas of said first layer portions, the spacers limit the distance between the electrical component surface and the support member surface to said height of the spacers.

14. The method of claim 13 wherein the layers are layers of electrically conductive material, electrically insulating material and electrically resistive material.

* * * * *